(12) United States Patent
Lay et al.

(10) Patent No.: US 6,531,330 B2
(45) Date of Patent: Mar. 11, 2003

(54) METHOD OF FABRICATING THIN FILM TRANSISTOR FLAT PANEL DISPLAY

(75) Inventors: Chung-Wen Lay, Taipei (TW); Meng-Yueh Wu, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 10/200,831

(22) Filed: Jul. 22, 2002

(65) Prior Publication Data

US 2003/0017636 A1 Jan. 23, 2003

(30) Foreign Application Priority Data

Jul. 23, 2001 (TW) ........................................ 90117932 A

(51) Int. Cl.[7] ............................................. H01L 21/00
(52) U.S. Cl. .................... 438/30; 438/149; 438/151; 438/479; 438/517
(58) Field of Search .......................... 438/30, 149, 151, 438/479, 517

(56) References Cited

U.S. PATENT DOCUMENTS 6,372,535 B1 * 4/2002 Lyu
2002/0121639 A1 * 9/2002 So et al.

* cited by examiner

*Primary Examiner*—John F. Niebling
*Assistant Examiner*—Stanetta Isaac
(74) *Attorney, Agent, or Firm*—Ladas & Parry

(57) ABSTRACT

A method of fabricating a thin film transistor (TFT) flat panel display. The method merely comprises four mask steps of: (1) using the first mask process for patterning the first conductive layer/gate insulating layer/amorphous silicon layer of the TFT, (2) using the second mask process for defining the passivation layer and the etching stopper, (3) using the third mask process for forming the Source/Drain, and (4) using the fourth mask process for forming the pixel electrode, whereby simplifying the fabricating process of the TFT flat panel display.

12 Claims, 19 Drawing Sheets

METHOD OF FABRICATING THIN FILM TRANSISTOR FLAT PANEL DISPLAY

BACKGROUND OF THE INVENTION

1. Field of the Invention

The present invention relates to a method of fabricating a flat panel display. In particular, the present invention relates to a method of fabricating a thin film transistor (TFT) flat panel display.

2. Description of the Related Art

FIGS. 1A to 1D illustrate the conventional method of fabricating a TFT liquid crystal flat panel display. Referring to FIG. 1A, a gate electrode 2 is formed on a substrate 1, and then an insulating layer 3 is formed to cover the gate electrode 2. Then, an amorphous silicon layer 40 and a silicon nitride 50 are formed on the insulating layer 3. Referring to FIG. 1B, an etching stopper 5 is formed by etching the silicon nitride 50. Referring to FIG. 1C, a doping silicon layer 6 (to be n+ doped amorphous silicon) is formed on the etching stopper 5 and the amorphous silicon 40. Referring to FIG. 1D, a metal layer is formed on the substrate 1, and then is etched to form a source electrode 7 and a drain electrode 8. Finally, a passivation layer 9 is formed. In the etching process, part of the metal layer and the doping silicon layer 6 are removed, and the etching stopper 5 is used for preventing the amorphous silicon layer 40 form etching damage.

The conventional method can be used to fabricate TFT flat displays; however it still has the spaces for improvement and simplification.

SUMMARY OF THE INVENTION

In order to improve and simplify the above-mentioned conventional manufacturing steps, the present invention proposes a new method of fabricating a TFT flat panel display, merely requiring four mask processes.

The present invention proposes a method of fabricating a TFT flat display is characterized by: (1) using the first mask process for patterning the first conductive layer/gate insulating layer/amorphous silicon layer of the TFT, (2) using the second mask process for defining the passivation layer and the etching stopper, (3) using the third mask process for forming the Source/Drain, and (4) using the fourth mask process for forming the pixel electrode, whereby simplifying the fabricating process of the TFT flat panel display.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENTS

First Embodiment

FIGS. 3A to 3D illustrate, in a cross-sectional view, the fabricating process of the first embodiment according to the present invention. In FIGS. 3A~3D, a thin film transistor (TFT) is formed on the I area (gate area) and a gate pad structure is formed on the II area. The I area in FIGS. 3A to 3D corresponds to the cross section view along the A–A' direction in FIGS. 2A to 2D. The II area in FIGS. 3A to 3D corresponds to the cross section view along the B–B' direction in FIGS. 2A to 2D.

Figure 1A:
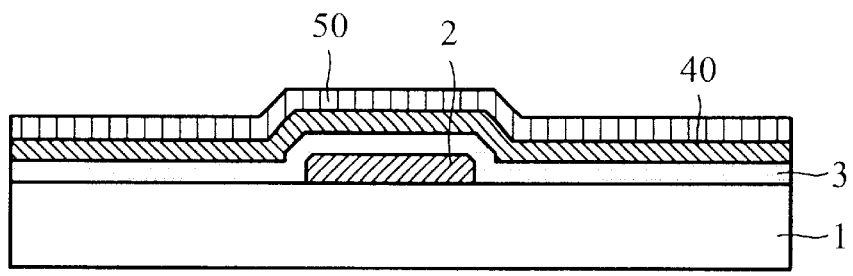
FIGS. 1A to 1D illustrate, in a cross-sectional view, the conventional method of fabricating a TFT liquid crystal flat panel display.
Figure 1B:
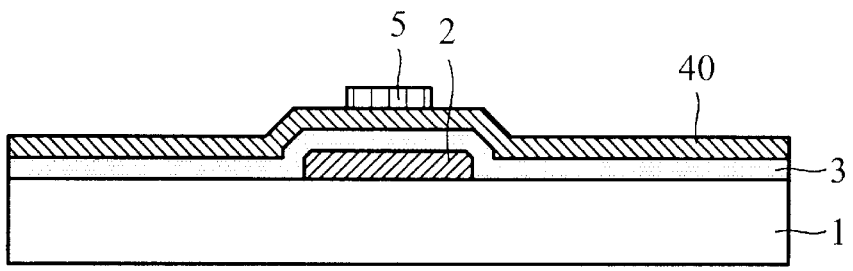
Figure 1C:
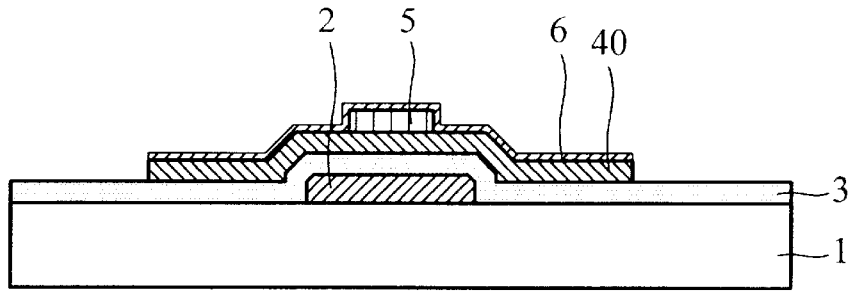
Figure 1D:
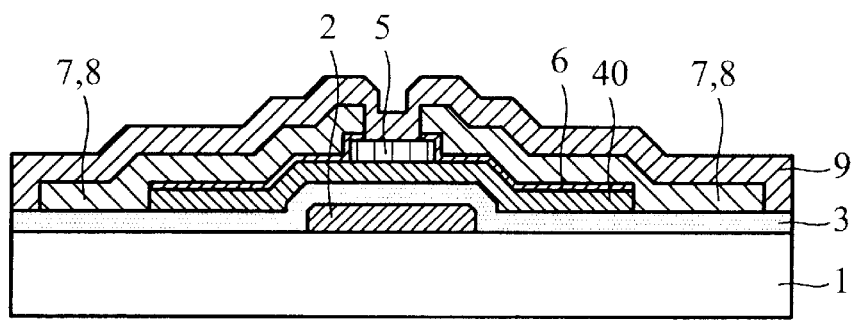
Figure 2A:
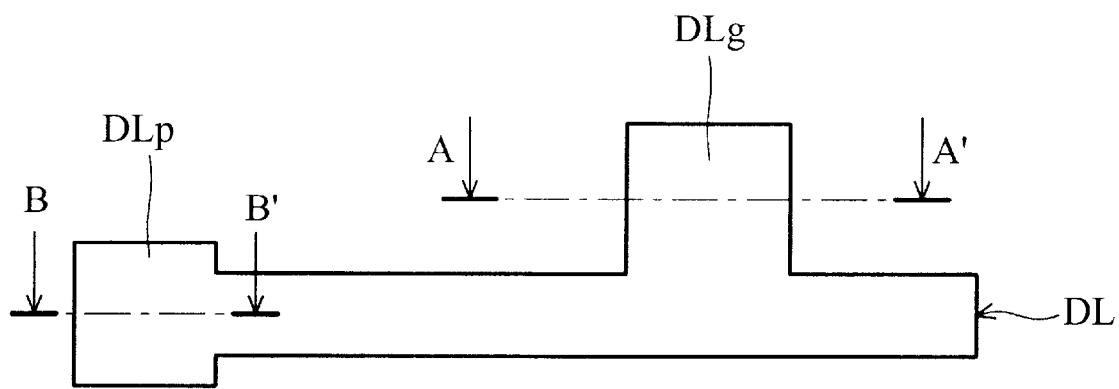
FIGS. 2A to 2D illustrate, in a top view, the fabricating process of the first embodiment according to the present invention.
Figure 3A:
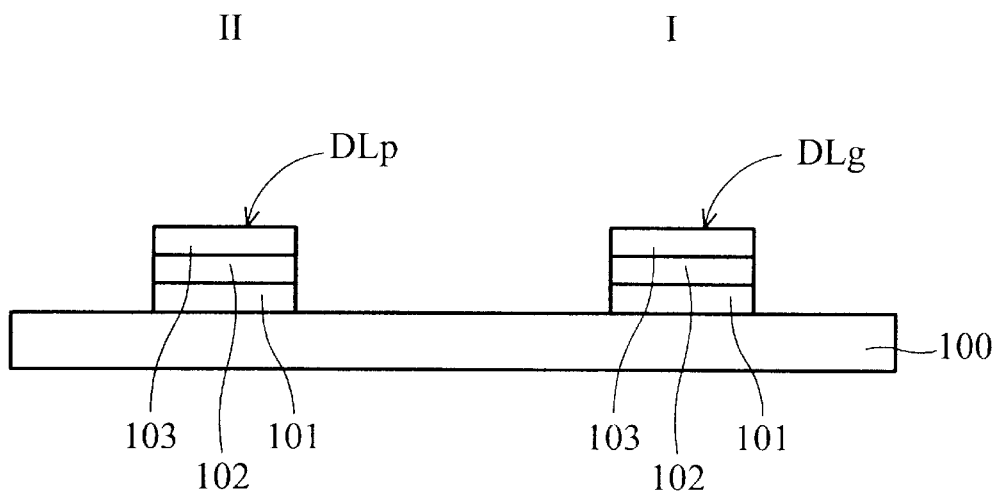
FIGS. 3A to 3D illustrate, in a cross-sectional view, the fabricating process of the first embodiment according to the present invention.

Referring to FIGS. 2A and 3A, a first conductive layer 101, an insulating layer 102 and a semiconductor layer 103 are sequentially formed on a transparent substrate 100. A scanning line structure (DL), a gate pad structure (DLp) and a gate structure (DLg) are formed after patterning the semiconductor layer 103, the insulating layer 102 and the first conductive layer 101. The gate pad structure DLp is formed at one end of the scanning line DL. The gate structure DLg extends from one side of the scanning line structure DL and the semiconductor layer 103 in the gate structure DLg serves as the channel layer of the TFT. In general, the substrate 100 is made of glass or quartz materials, the first conductive layer 101 is metal, the insulating layer 102 is silicon oxide ($SiN_x$), and the semiconductor layer 103 is amorphous silicon serving as a gate electrode.

Figure 2B:
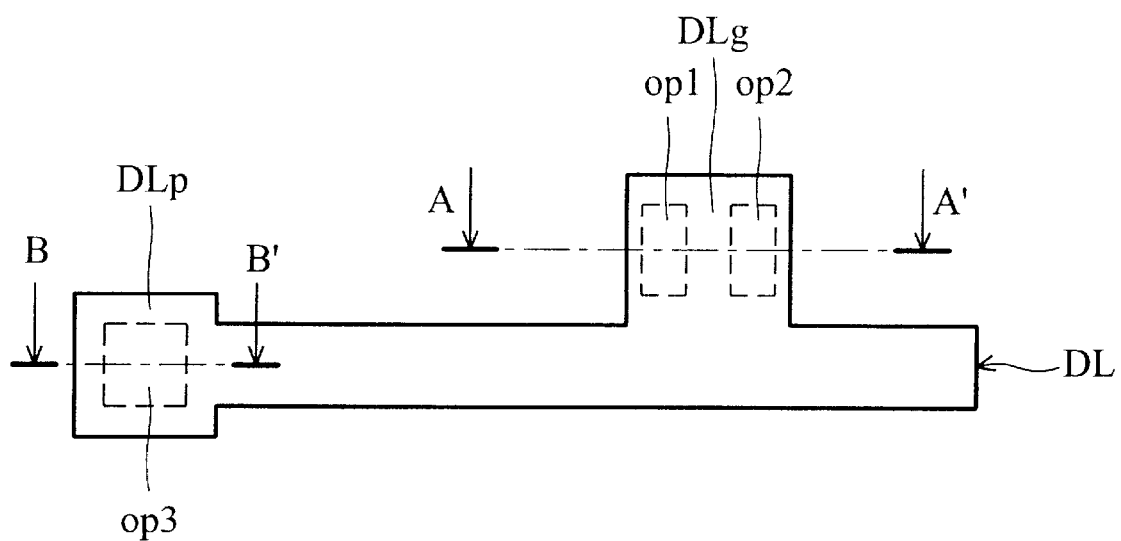
Figure 3B:
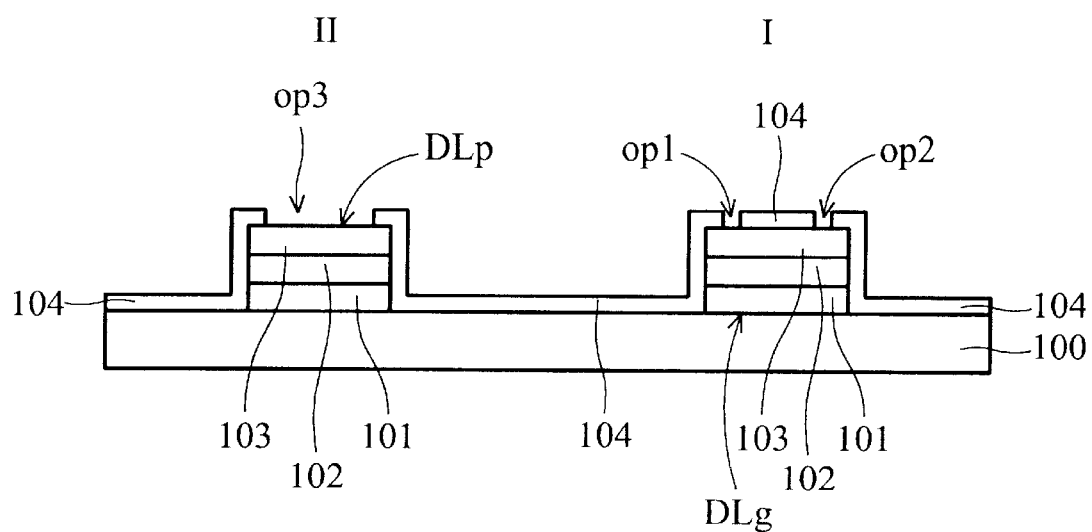

Referring to FIGS. 2B and 3B, a passivation layer 104 is formed to cover the scanning line structure DL, the gate structure DLg and the gate pad structure DLp on substrate 100. The passivation layer 103 is then patterned to form a first and second openings op1 and op2 in the gate structure DLg and a third opening op3 in the gate pad structure DLp to expose the corresponding semiconductor layer 103. The above-mentioned a passivation layer is made of silicon nitride ($SiN_x$) or other organic polymer.

Figure 2C:
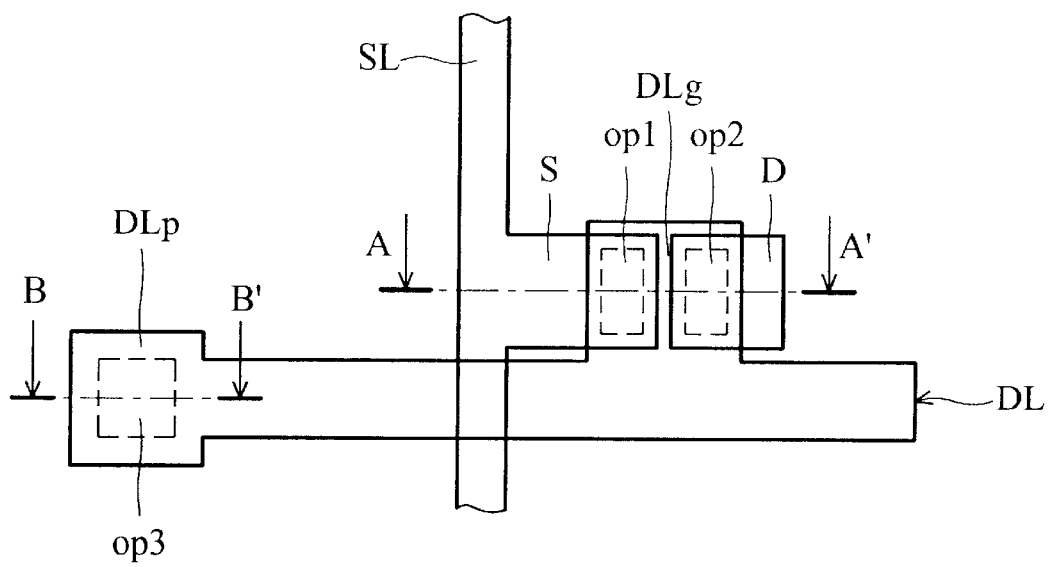
Figure 3C:
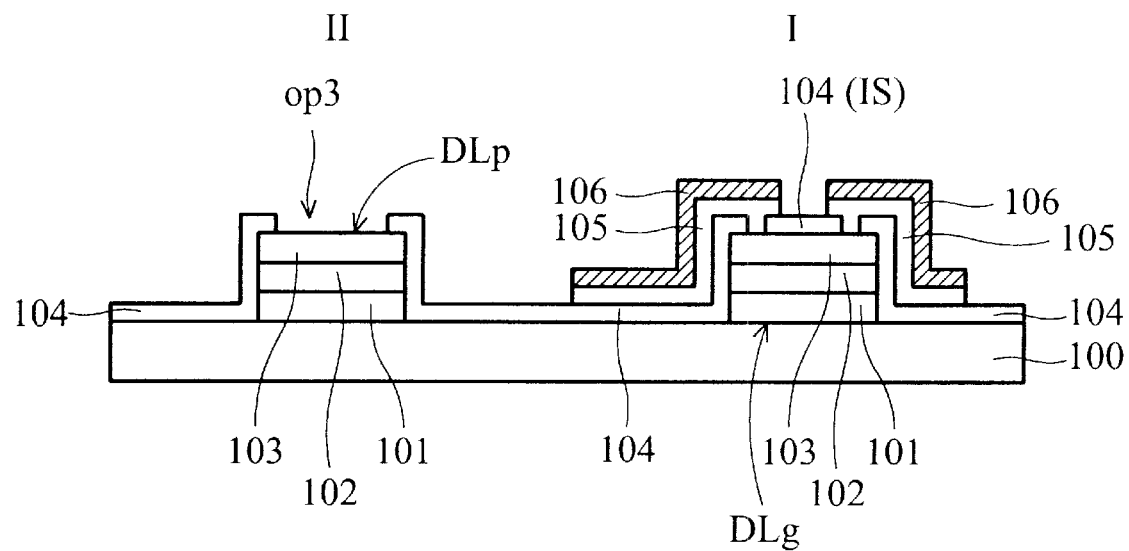

Referring to FIGS. 2C and 3C, a doping silicon layer 105 and a second conductive layer 106 are formed on substrate 100. The conductive layer 106 is made of metal and the doping silicon layer is made of n+ doped silicon. The doping silicon layer 105 and the second conductive layer 106 are then patterned to form a signal line SL, a source S and a drain D on the gate structure DLg. The signal line SL is perpendicular to the scanning line structure DL. The doping silicon layer 105 in the source S and drain D are electrically connected to the semiconductor layer 103 through the openings op1 and op2.

The passivation layer 104 between op1 and op2 serves as an etching stopper IS (or an island etching stopper). The etching stopper IS is used to prevent the semiconductor layer 103 (over the gate structure DLg) from damages when etching the doping silicon layer 105 and the second conductive layer 106.

Figure 2D:
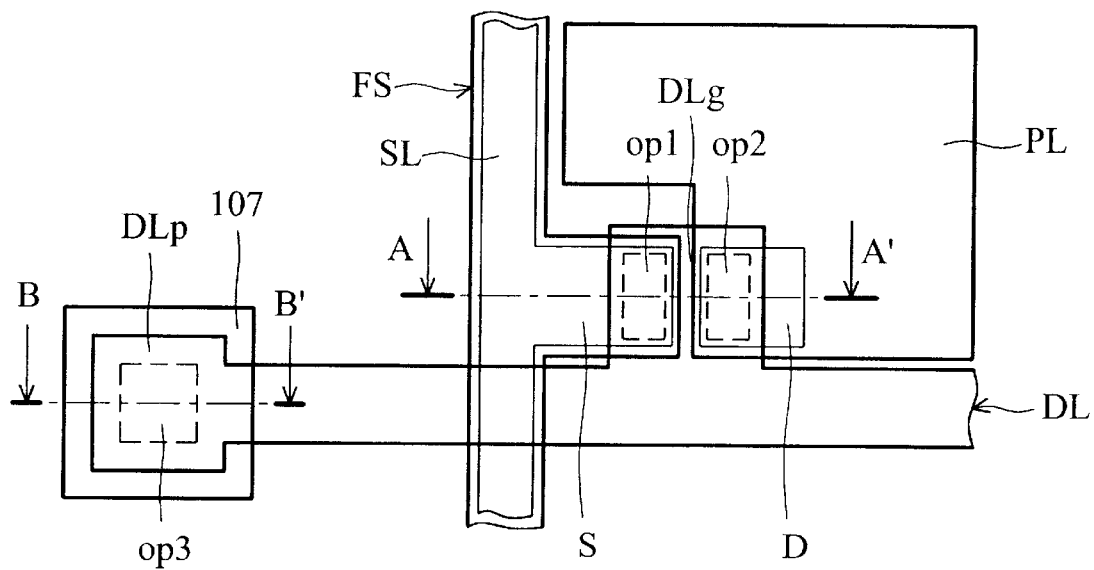
Figure 3D:
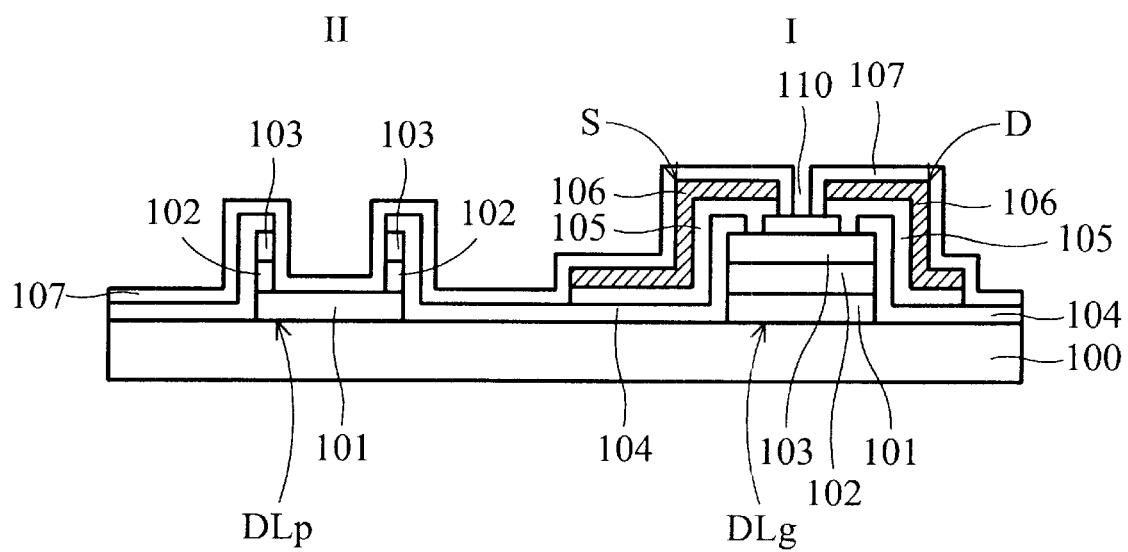

Referring to FIGS. 2D and 3D, the semiconductor layer 103 and the insulating layer 102 in the gate pad structure DLp are etched to expose the conductive layer 101 in the opening op3. Then, a transparent electrode layer 107 is formed on the substrate 100 and covers the source S, the drain D and the gate pad structure DLp. Finally, the electrode layer 107 is patterned to form a pixel electrode PL electrically connected to the drain D and a dummy signal line FS covering the source S and the signal line SL. The etched electrode layer 107 is electrically connected to the first conductive layer 101 of the gate pad structure DLp.

The above-mentioned electrode layer 107 is preferably made of indium tin oxide (ITO). The electrode layer 107 also covers the side walls of the conductive layers 106 of the source S and drain D.

Second Embodiment

FIGS. 4A to 4D illustrate, in a cross-sectional view, the fabricating process of the second embodiment according to the present invention. The top view of the fabricating process of the second embodiment is the same as that depicted in FIGS. 2A to 2D. Only difference between the fabrication methods that described in first embodiment and in this present second embodiment is that a second insulating layer 202 forms on the semiconductor layer 103 to protect it.

Figure 4A:
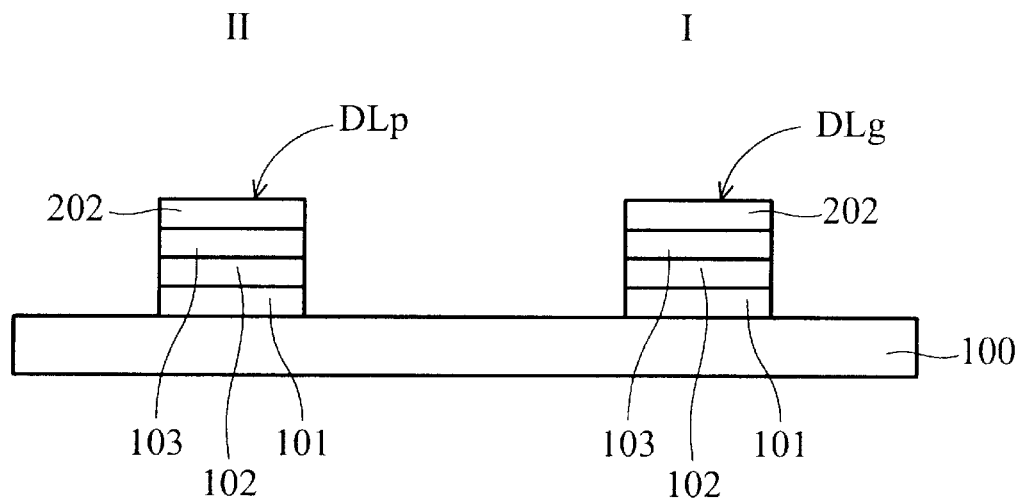
FIGS. 4A to 4D illustrate, in a cross-sectional view, the fabricating process of the second embodiment according to the present invention.

Referring to FIGS. 2A and 4A, a first conductive layer 101, a first insulating layer 102, a semiconductor layer 103 and a second insulting layer 202 are sequentially formed on a transparent substrate 100. A scanning line structure (DL), a gate pad structure (DLp) and a gate structure (DLg) are formed after patterning the second insulting layer 202, the semiconductor layer 103, the first insulting layer 102 and the first conductive layer 101. The second insulating layer 202 is preferably made of silicon nitride ($SiN_x$).

Figure 4B:
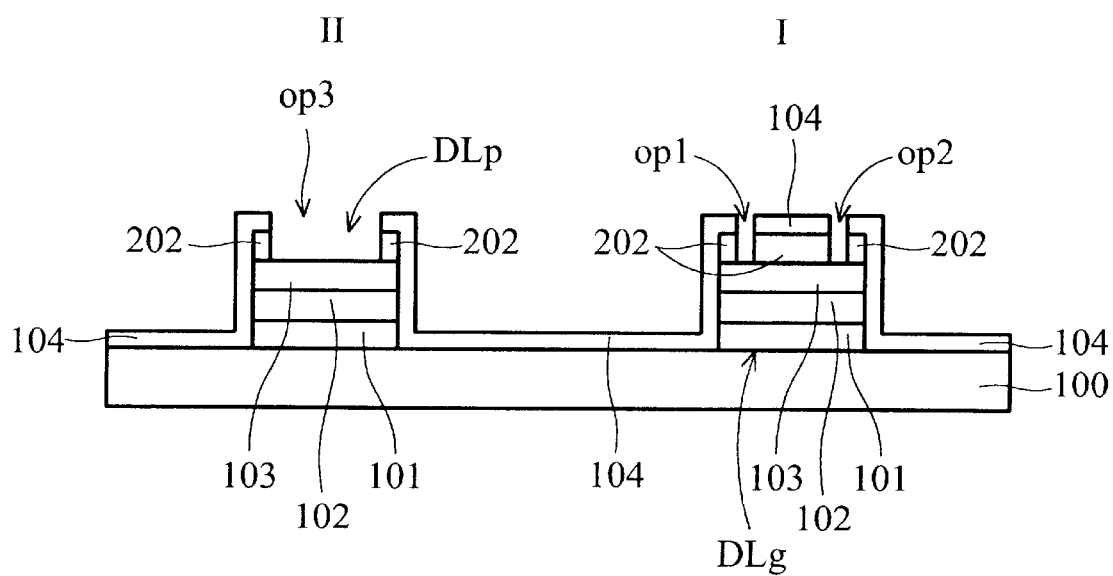

Referring to FIGS. 2B and 4B, a passivation layer 104 is formed to cover the scanning line DL, the gate DLg and the gate pad DLp on the substrate 100. The passivation layer 104 and the second insulating layer 202 are then patterned to form a first and second openings op1 and op2 on the gate structure DLg and a third opening op3 on the gate pad structure DLp to expose the semiconductor layer 103.

Figure 4C:
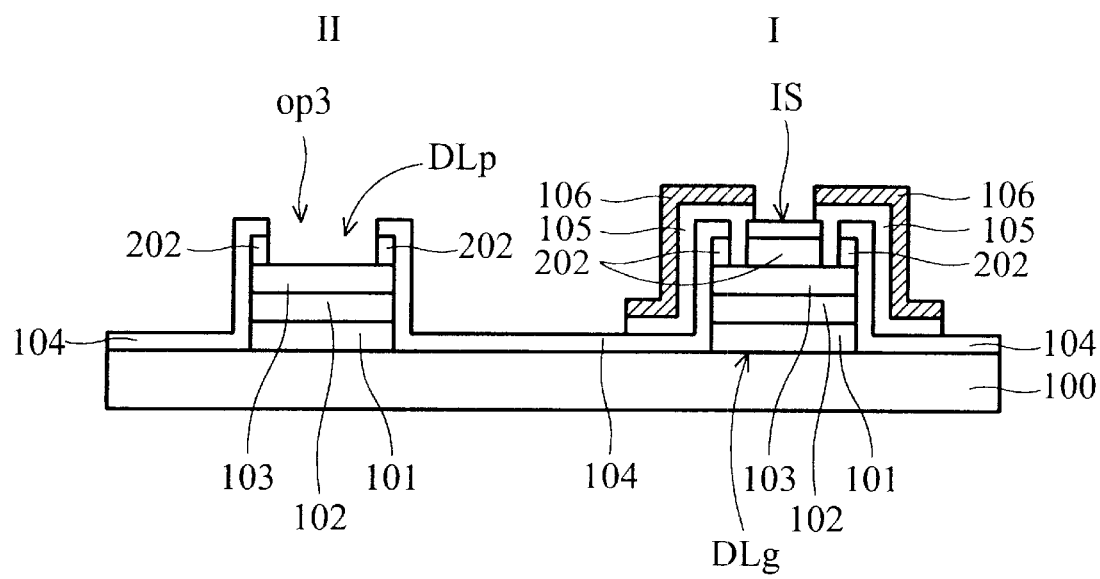

Referring to FIGS. 2C and 4C, a doping silicon layer 105 and a second conductive layer 106 are formed on the substrate 100. The second conductive layer 106 is made of metal and the doping silicon layer is made of n+ doped silicon. The doping silicon layer 105 and the second conductive layer 106 are patterned to form a signal line SL, a source S and a drain D on the gate structure DLg. The doping silicon layers 105 in the source S and drain D are electrically connected to the semiconductor layer 103 through the openings op1 and op2.

The passivation layer 104 and the second insulting layer 202, between the first and second openings op1 and op2, serve as a etching stopper IS (or a island etching stopper) for preventing the semiconductor layer 103 (channel layer) from damages when etching the second conductive layer 106 and the doping silicon layer 105.

Figure 4D:
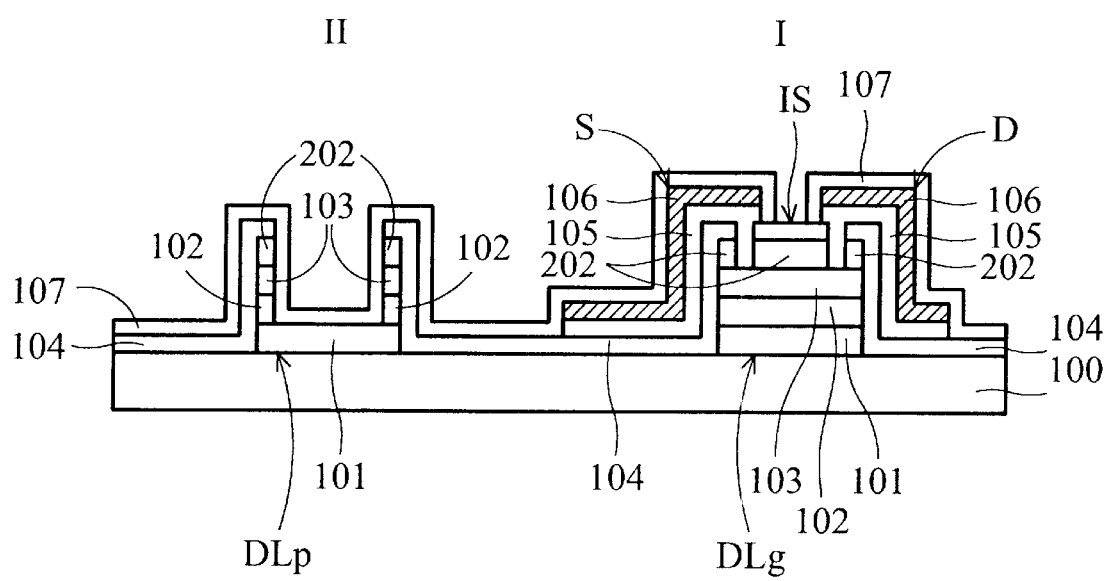

Referring to FIGS. 2D and 4D, the semiconductor layer 103 and the first insulating layer 102 in the third opening op3 on the gate pad structure DLp are removed first to reveal the first conductive layer 101 in the third opening op3. Then a transparent electrode layer 107 is formed on the substrate 100 and covers the source S, the drain D and the gate pad structure DLp. Finally, the electrode layer 107 is patterned to form a pixel electrode PL which is electrically connected to the drain D through the openings op2, and a dummy signal line FS which is electrically connected to the source S through the opening op1, covering the signal line SL. The etched electrode layer 107 is electrically connected to the first conductive layer 101 of the gate pad structure DLp through the third openings op3.

In this embodiment, a thin silicon nitride layer (the second insulating layer 202) is further formed on the semiconductor layer 103 to prevent the semiconductor layer from oxidation due to long-timely exposing to the air.

Third Embodiment

FIGS. 5A to 5D illustrate, in a cross-sectional view, the fabricating process of the third embodiment according to the present invention. In FIGS. 6A~6D, a thin film transistor (TFT) is formed on the I area (gate area) and a gate pad structure is formed on the II area. The I area in FIGS. 6A to 6D correspond to the cross section view along the A–A' direction in FIGS. 5A to 5D. The II area in FIGS. 6A to 6D correspond to the cross section view along the B–B' direction in FIGS. 5A to 5D.

Figure 5A:
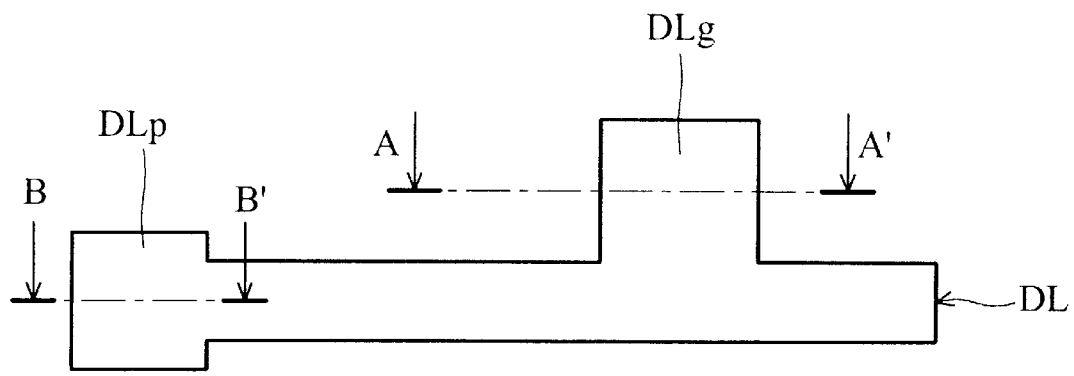
FIGS. 5A to 5D illustrate, in a top view, the fabricating process of the third embodiment according to the present invention.
Figure 6A:
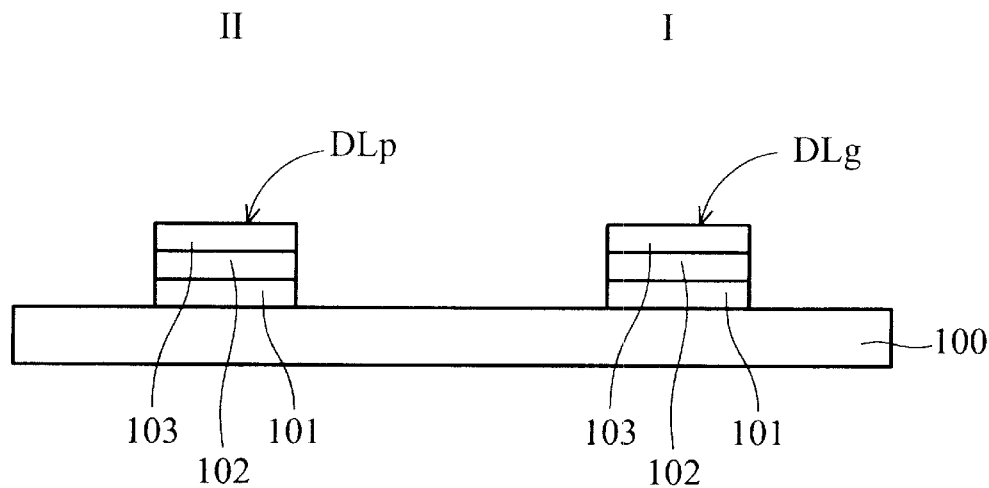
FIGS. 6A to 6D illustrate, in a cross-sectional view, the fabricating process of the third embodiment according to the present invention.

Referring to FIGS. 5A and 6A, a first conductive layer 101, an insulating layer 102, a semiconductor layer 103 are sequentially formed on a transparent substrate 100. Then, a scanning line structure (DL), a gate pad structure (DLp) and a gate structure (DLg) are formed after patterning the semiconductor layer 103, the insulating layer 102 and the first conductive layer 101. The gate pad structure DLp is formed at one end of the scanning line DL. The gate structure DLg extends from one side of the scanning line DL and the semiconductor layer 103 in the gate structure DLg serves as a channel layer of the TFT. In general, the substrate 100 is made of glass or quartz materials, the first conductive layer 101 is metal, the insulating layer 102 is silicon oxide, and the semiconductor layer 103 is amorphous silicon serving as a gate electrode.

Figure 5B:
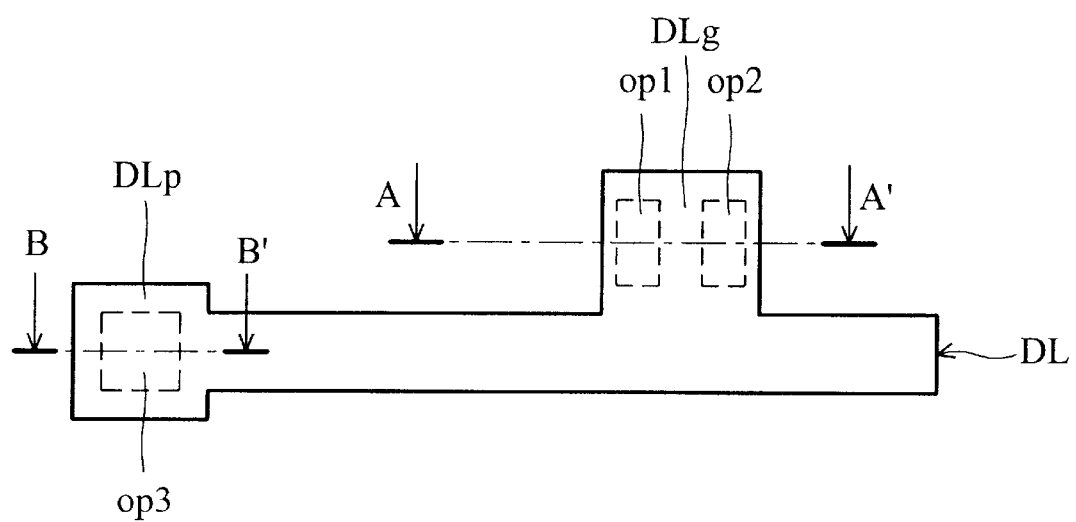
Figure 6B:
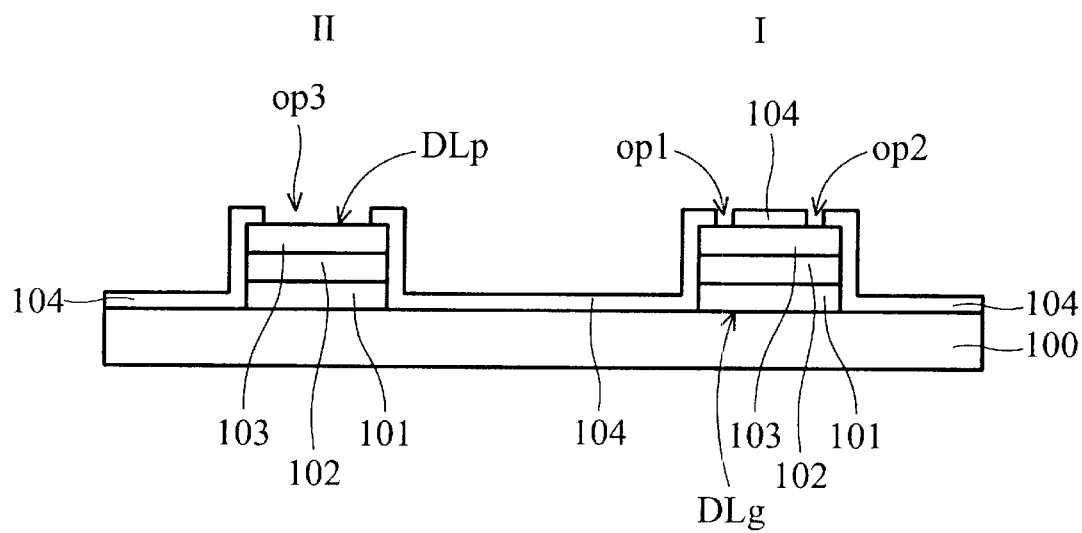

Referring to FIGS. 5B and 6B, a passivation layer 104 is formed to cover the scanning line DL, the gate structure DLg and the gate pad structure DLp on substrate 100. The passivation layer 103 is then patterned to form a first and second openings op1 and op2 in the gate structure DLg and a third opening op3 in the gate pad structure DLp to expose the corresponding semiconductor layer 103. The above-mentioned a passivation layer is made of silicon nitride ($SiN_x$) or other organic polymer.

Figure 5C:
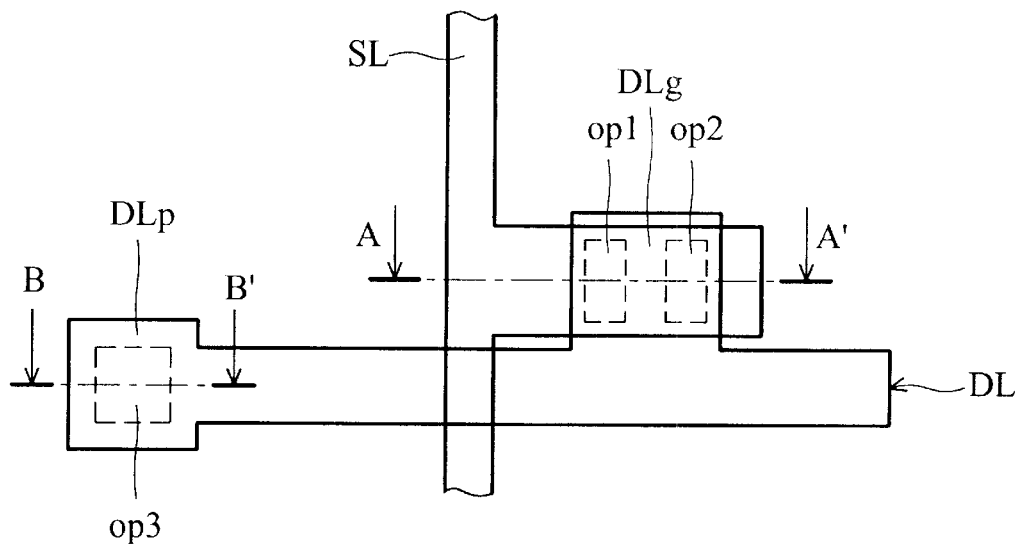
Figure 6C:
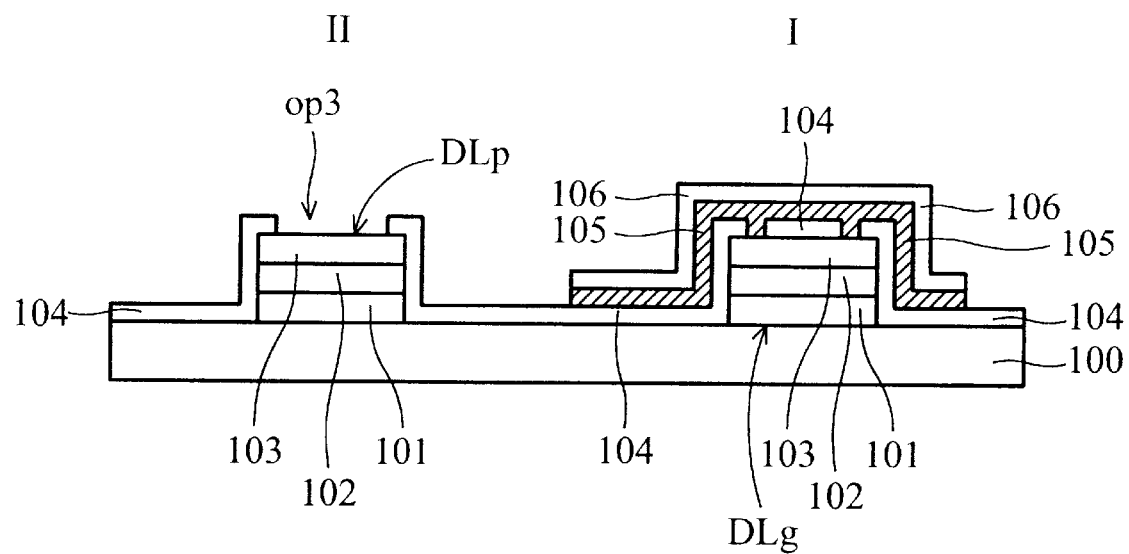

Referring to FIGS. 5C and 6C, a doping silicon layer 105 and a second conductive layer 106 are formed on the substrate 100, and then are patterned to form a stack structure on the gate structure DLg, and a signal line SL perpendicular to the scanning line structure DL. The doping silicon layer 105 of the stack structure is electrically connected to the semiconductor layer 103 on the gate structure DLg through the openings op1 and op2.

Figure 5D:
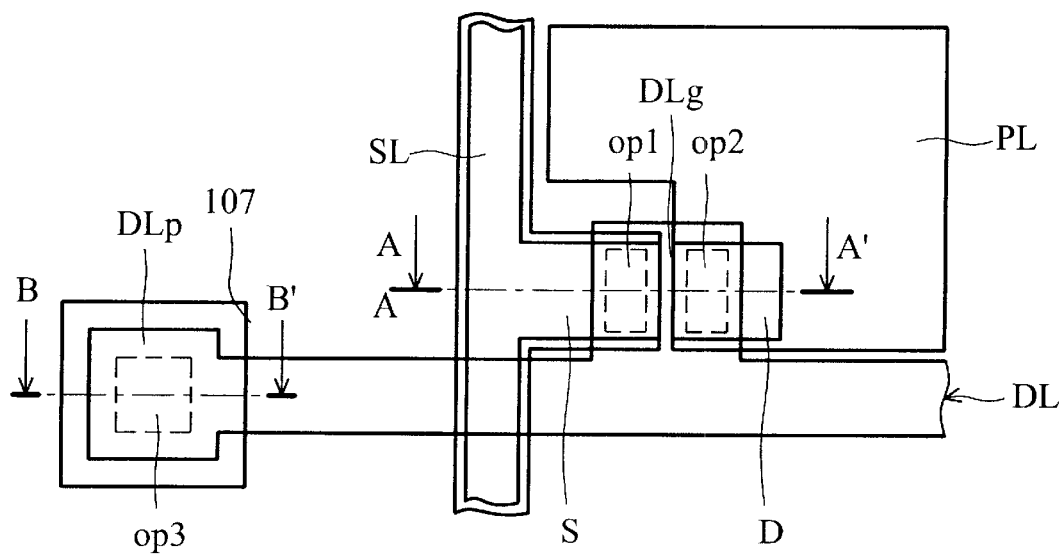
Figure 6D:
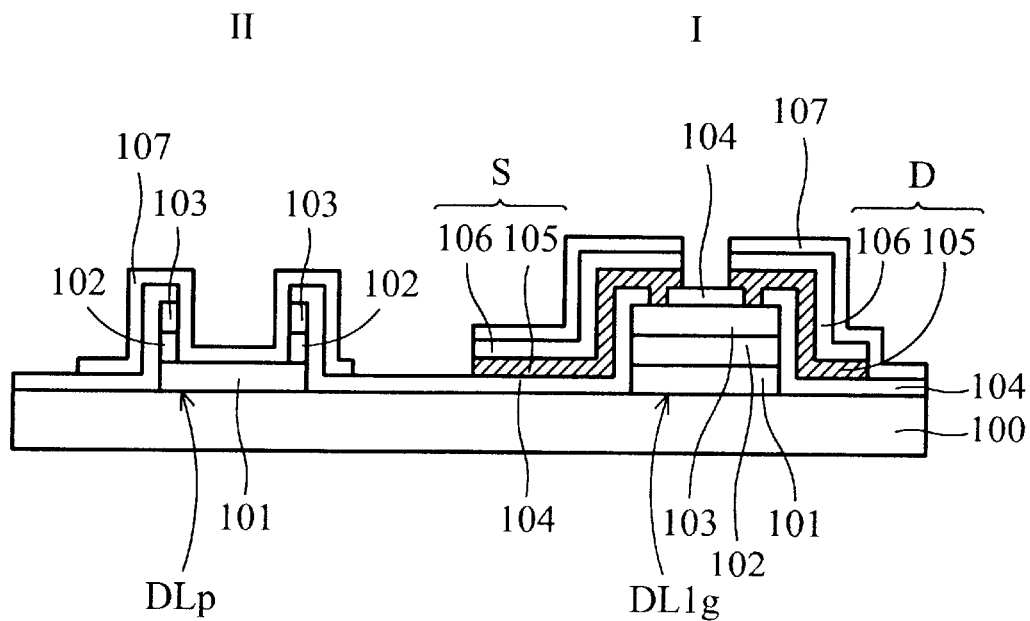

Referring to FIGS. 5D and 6D, the semiconductor layer 103 and the first insulting layer 102 in the opening op3 on the gate pad structure DLp are removed to reveal the first conductive layer 100 in the opening op3 on the gate pad structure DLp. Then, a transparent electrode layer 107 is formed on the substrate 100. Next, the electrode layer 107 and the stack structure (that is the second conductive layer 106 and the doping silicon layer 105 cover the gate structure DLg) are patterned to form a source S and a drain D over the gate structure DLg. Moreover, a pixel electrode PL is also formed by patterning the electrode layer 107. The pixel electrode PL is electrically connected to the drain D. The patterned electrode 107 also covers the gate pad structure DLp and is electrically connected to the first conductive layer 101 of the gate pad structure DLp through the third opening op3.

The above mentioned electrode layer 107 is preferably made of indium tin oxide ITO and uncovers the sidewalls of the second conductive layer 106 of the source S and drain D to reduce the size of the TFT channel.

Fourth Embodiment

FIGS. 7A to 7D illustrate, in a top view, the fabricating process of the third embodiment according to the present invention. In FIGS. 8A to 8D, a thin film transistor (TFT) is formed on the I area (gate area) and a gate pad structure is formed on the II area. The I area in FIGS. 8A to 8D correspond to the cross-sectional view along the A–A' direction in FIGS. 7A to 7D. The II area in FIGS. 8A to 8D correspond to the cross-sectional view along the B–B' direction in FIGS. 7A to 7D.

Referring to FIGS. 7A and 8A, FIGS. 7B and 8B, a first conductive layer 101, an insulating layer 102, a semiconductor layer 103 and the passivation layer 104 are formed on a substrate 100. Patterning of the above layers form a scanning line structure (DL), a gate pad structure (DLp) and a gate structure (DLg). The openings op1, op2 and op3 are formed on the gate structure DLg and the gate pad structure DLp to expose the semiconductor layer 103. The detailed fabrication process is the same as that described in the first embodiment; therefore not described in this embodiment for brevity. Further, a second insulating layer (not shown in figures) can be formed on the semiconductor layer 103 for protection.

Figure 7A:
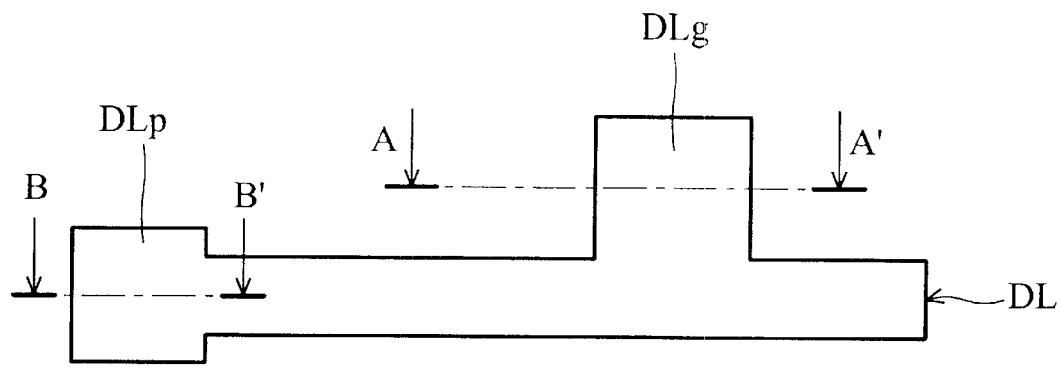
FIGS. 7A to 7D illustrate, in a top view, the fabricating process of the fourth embodiment according to the present invention.
Figure 7B:
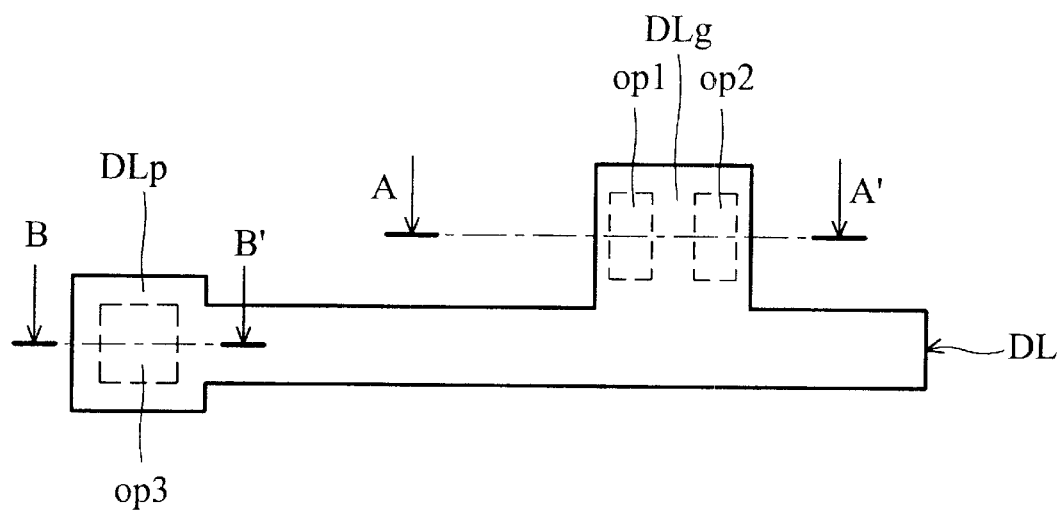
Figure 7C:
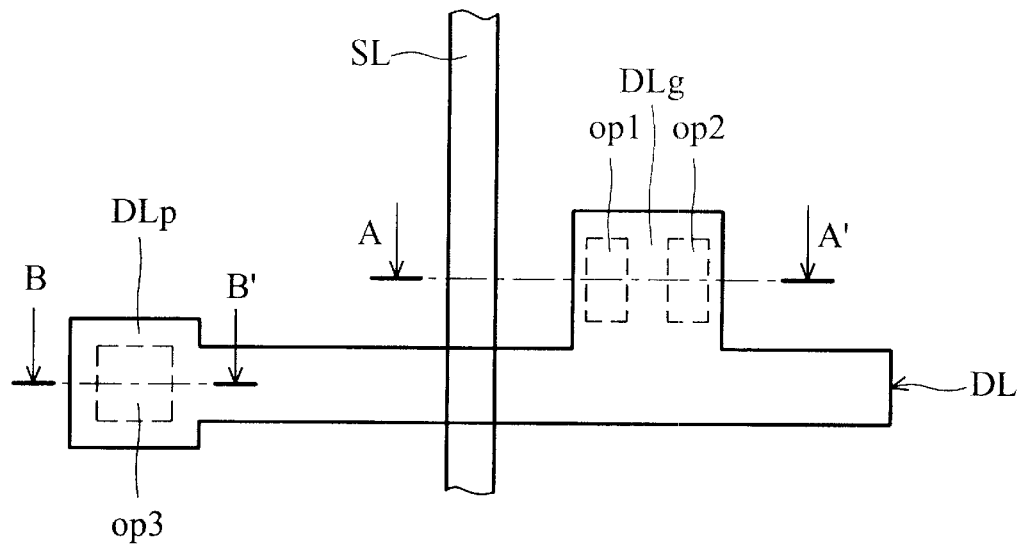
Figure 8A:
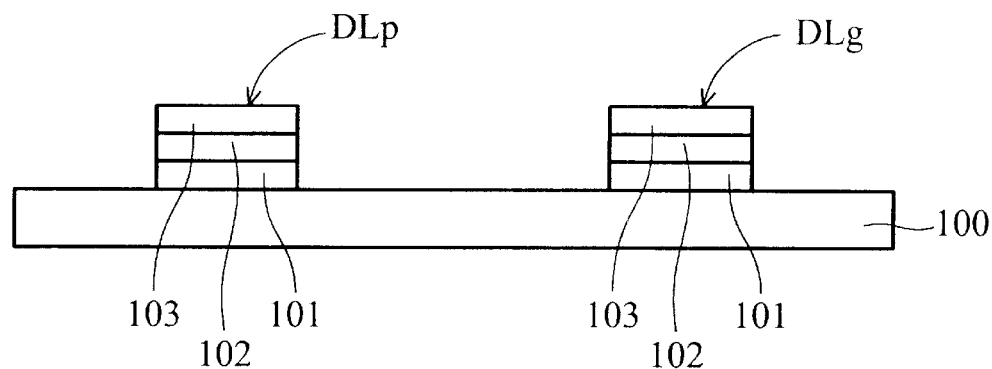
FIGS. 8A to 8D illustrate, in a cross-sectional view, the fabricating process of the fourth embodiment according to the present invention.
Figure 8B:
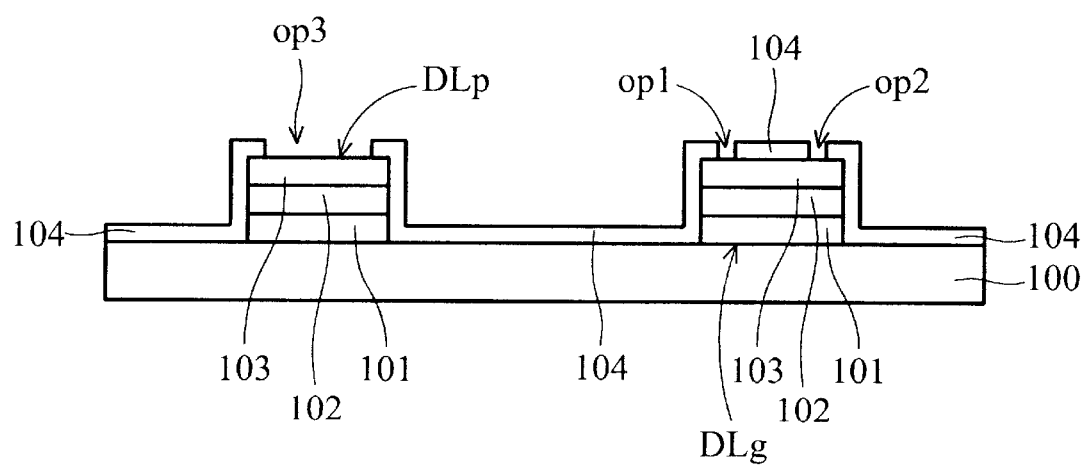
Figure 8C:
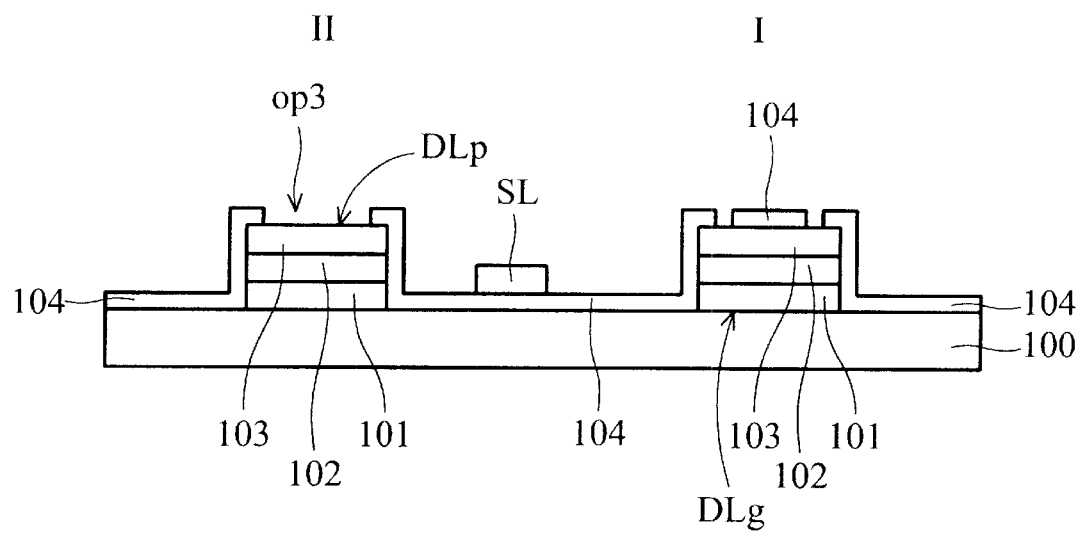

Referring to FIGS. 7C and 8C, a second conductive layer 106 is formed and patterned on the passivation layer 104. The patterned second conductive layer 106 serves as a signal line SL perpendicular to the scanning line structure DL.

Figure 7D:
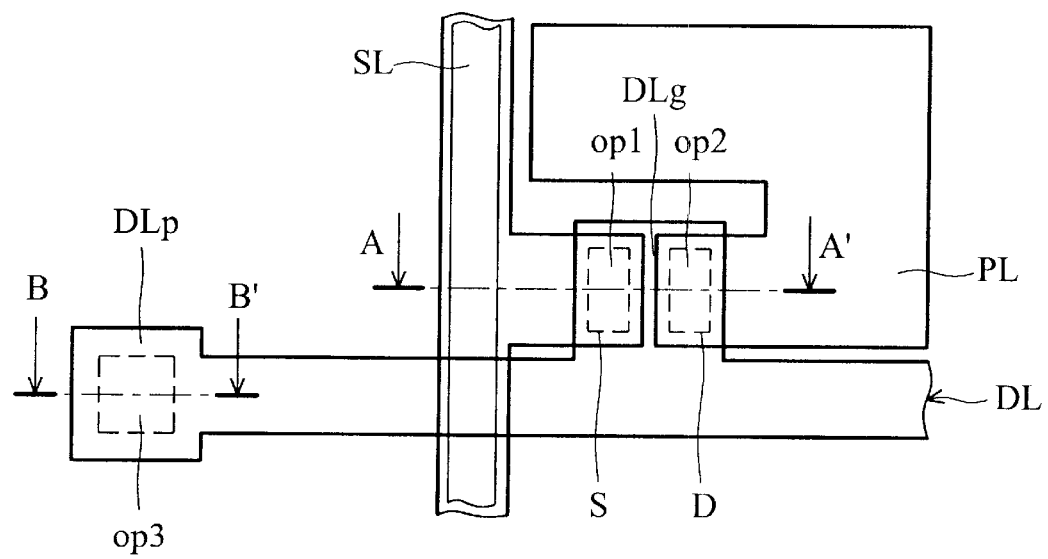
Figure 8D:
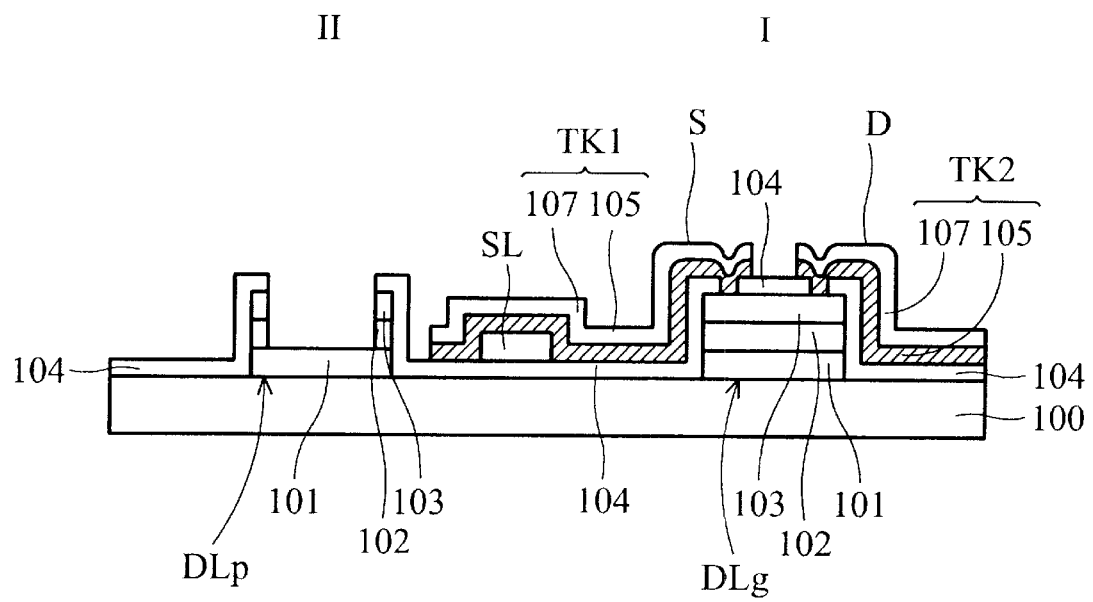

Referring to FIGS. 7D and 8D, a doping silicon layer 105 and a transparent electrode layer 107 are sequentially formed on the substrate 100 and cover the signal line SL and the gate structure DLg. Then, the doping silicon layer 105 and the electrode layer 107 are patterned to form a source S and a drain D on the gate structure DLg, and a first part TK1 and a second part TK2, as depicted in FIGS. 7D and 8D. Furthermore, the first part TK1 covers the signal line SL and is electrically connected to the source S. The second part TK2 serves as a pixel electrode PL and electrically connects to the drain D. The doping silicon layers 105 of the source S and the drain D is electrically connected to the semiconductor layer 103 through the openings op1 and op2 on the gate respectively.

Finally, the conductive layer 101 exposes in the opening op3 by removing the insulating layer 102 and the semiconductor layer 103 on gate pad structure DLp.

Fifth Embodiment

Figure 9A:
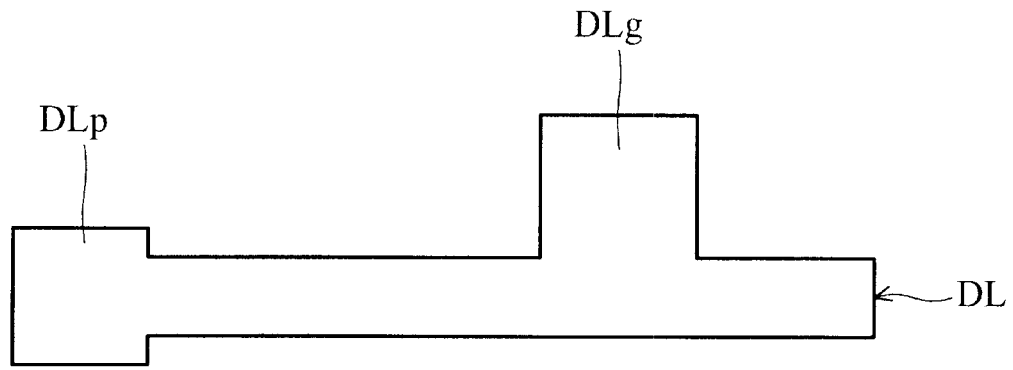
FIGS. 9A to 9C illustrate, in a top view, the fabricating process of the fifth embodiment according to the present invention.
Figure 9B:
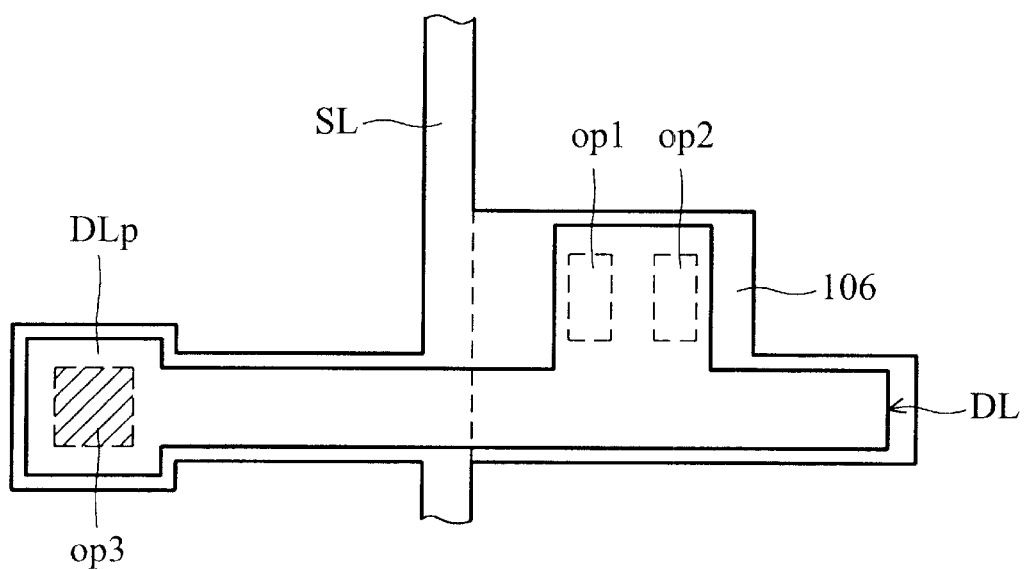
Figure 9C:
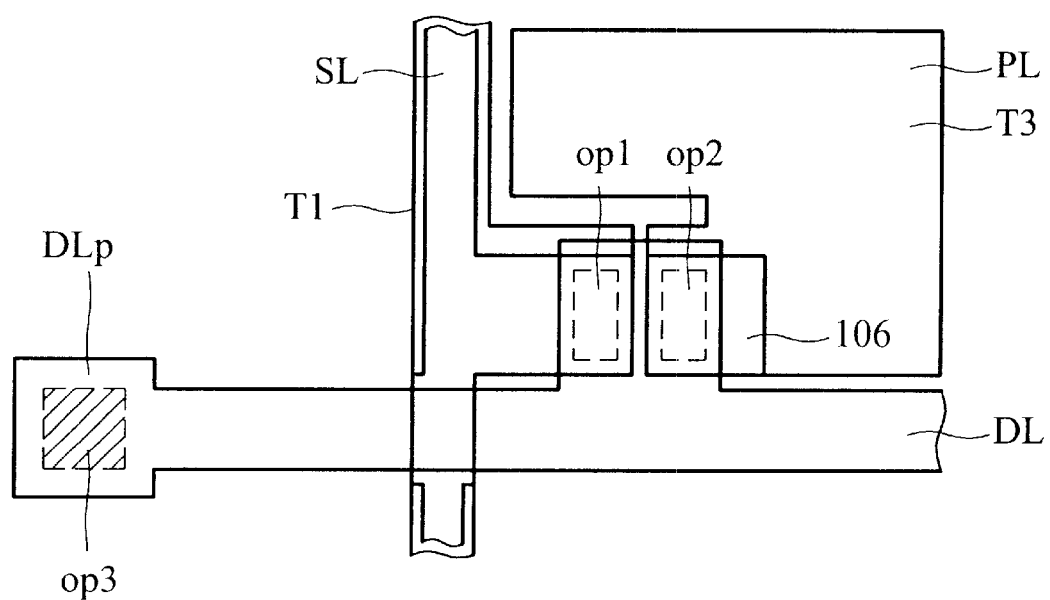
Figure 10A:
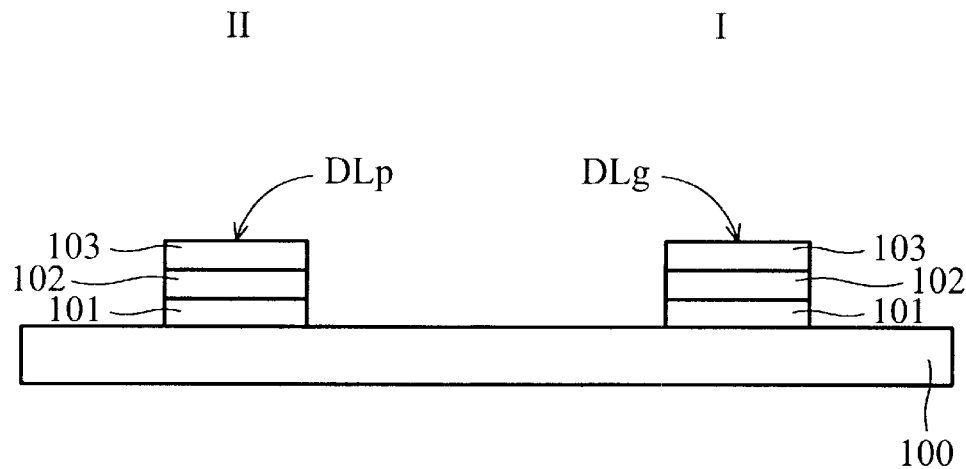
FIGS. 10A to 10C illustrate, in a cross-sectional view; the fabricating process of the fifth embodiment according to the present invention.
Figure 10B:
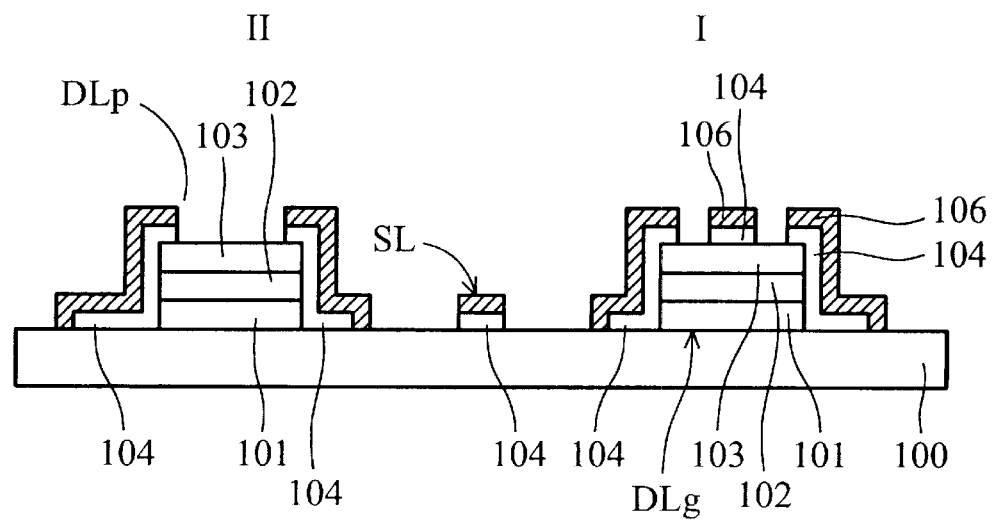
Figure 10C:
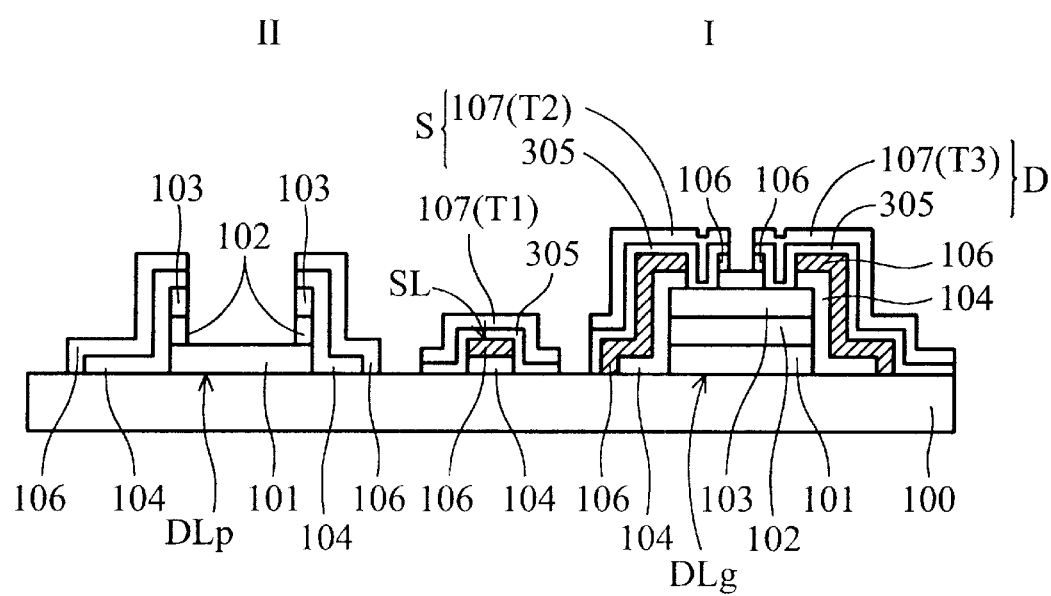

FIGS. 9A to 9C illustrate, in a top view, the fabricating process of the third embodiment according to the present invention. In FIGS. 10A to 10C, a thin film transistor (TFT) is formed on the I area (gate area) and a gate pad structure is formed on the II area. The I area in FIGS. 10A to 10C correspond to the cross-sectional view along the A–A' direction in FIGS. 9A to 9C. The II area in FIGS. 10A to 10C correspond to the cross-sectional view along the B–B' direction in FIGS. 9A to 9C.

Referring to FIGS. 9A and 10A, a first conductive layer 101, an insulating layer 102 and a semiconductor layer 103 are formed on a substrate 100. The above layers are patterned to form a scanning line structure (DL), a gate pad structure (DLp) and a gate structure (DLg) on the substrate 100. The gate pad structure DLp is formed at one end of the scanning line structure DL. The gate structure DLg extends from one side of the scanning line structure DL and the semiconductor layer 103 in the gate structure DLg serves as a channel layer of the TFT.

Referring to FIGS. 9B and 10B, a passivation layer 104 and a second conductive layer 106 are formed sequentially on the substrate 100. Then, the second conductive layer 106 and the passivation layer 104 are patterned to cover the scanning line structure DL, the gate structure DLg and the gate pad structure DLp and further form a signal line SL. The signal line SL is perpendicular to the scanning line structure DL. In additional, a first and a second openings op1 and op2 are formed in the gate structure DLg and a third opening op3 is formed in the gate pad DLp. The semiconductor layer 103 exposes in the openings op1, op2 and op3.

Referring to FIGS. 9C and 10C, a doping silicon layer 305 and a transparent electrode layer 107 are sequentially formed on the substrate 100. The doping silicon layer is electrically connected to the semiconductor layer 103 through the openings op1 and op2. Then, the electrode layer 107 and the doping silicon layer 305 are patterned to form a source S and a drain D on the gate structure DLg. Furthermore, the first part T1 of the electrode layer 107 covers the signal line SL. The second part T2 of the electrode layer 107 forms a part of the source S. The third part T3 of the electrode layer 107 forms a pixel electrode PL, covering the drain D. The first conductive layer 101 exposes on the gate pad DLp by removing of the semiconductor layer 103 and the insulating 102 in the openings op3.

Finally, while the invention has been described by way of examples and in terms of the preferred embodiments, it is to be understood that the invention is not limited to the disclosed several embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of fabricating a thin film transistor (TFT) flat panel display, comprising:
   (a) providing a substrate which has a first conductive layer, a first insulating layer and a semiconductor layer sequentially formed thereon;
   (b) patterning the semiconductor layer, the first insulating layer and the first conductive layer to form a scanning line structure, a gate pad structure and a gate structure; wherein the gate pad structure is formed at one end of the scanning line structure and the gate structure is formed at one side of the scanning line structure and extends to the gate structure;
   (c) forming a passivation layer to cover the scanning line structure, the gate pad structure, the gate structure;
   (d) patterning the passivation layer so as to form a first opening and a second opening on the gate structure and a third opening on the gate pad structure to expose the semiconductor layer;

(e) sequentially forming a doping silicon layer and a second conductive layer on the substrate;

(f) patterning the second conductive layer and the doping silicon layer to form a signal line perpendicular to the scanning line structure and a source and a drain over the gate structure; wherein a channel is defined between the source and the drain on the gate, and the patterned doping silicon layers of the source and drain over the gate structure is electrically connected to the semiconductor layer through the first and second openings respectively;

(g) patterning the semiconductor layer and the insulating layer on the gate pad structure and removing the semiconductor layer and the insulating layer in the third opening to expose the first conductive layer;

(h) forming an electrode layer on the substrate, covering the source, the drain and the gate pad structure; and (i) patterning the electrode layer to form a pixel electrode electrically connected to the drain.

2. The method as claimed in claim 1, wherein in the step (i) the electrode layer is patterned to form a dummy signal line which is electrically isolated with the pixel electrode, covers the signal line structure and is electrically connected to the first conductive layer in the gate pad structure through the third opening.

3. The method as claimed in claim 1, wherein in the step (b) a second insulating layer is further formed on the semiconductor layer to prevent oxidation of the semiconductor layer.

4. The method as claimed in claim 3, wherein in step (d) the first, second and third openings further penetrate the second insulting layer to expose the semiconductor layer.

5. A fabrication method of thin film transistor (TFT) flat panel display, comprising:

(a) providing a substrate which has a first conductive layer, a first insulating layer and a semiconductor layer sequentially formed thereon;

(b) patterning the semiconductor layer, the first insulating layer and the first conductive layer to form a scanning line structure, a gate pad structure and a gate structure; wherein the gate pad structure is formed at one end of the scanning line structure and the gate structure is formed at one side of the scanning line structure and extends to the gate structure;

(c) forming a passivation layer to cover the scanning line structure, the gate pad structure and the gate structure on the substrate;

(d) patterning the passivation layer so as to form a first opening and a second opening on the gate structure and a third opening on the gate pad structure;

(e) forming a doping silicon layer and a second conductive layer on the substrate;

(f) patterning the second conductive layer and the doping layer to form a stack layer covering the gate structure, and the doping silicon layer of the stack structure connects to the semiconductor layer of the gate structure through the first and second openings;

(g) patterning the semiconductor layer and the first insulting layer in the gate pad structure to expose the first conductive layer of the gate pad structure in the third opening;

(i) forming an electrode layer on the substrate and covering the stack structure; and (j) patterning the electrode layer, the second conductive layer and the doping layer to form a source and a drain in the stack structure, and a pixel electrode coupled to the drain.

6. The method as claimed in claim 5, wherein a second insulating layer is formed in step (a) and patterned in the step (b), and expose in the first, second and third openings when patterning the passivation layer in step (c).

7. The method as claimed in claim 6, wherein the second conductive layer is patterned to further form a signal line in step (f) and the electrode layer is patterned to further form a dummy signal line layer to cover the signal line in step (j).

8. A method of fabricating a thin film transistor (TFT) flat panel display, comprising:

(a) providing a substrate which has a first conductive layer, a first insulating layer and a semiconductor layer sequentially formed thereon;

(b) patterning the semiconductor layer, the first insulating layer and the first conductive layer to form a scanning line structure, a gate pad structure and a gate structure; wherein the gate pad structure is formed at one end of the scanning line structure and the gate structure is formed at one side of the scanning line structure and extends to the gate structure;

(c) forming a passivation layer to cover the scanning line structure, the gate pad structure and the gate structure on the substrate;

(d) patterning the passivation layer so as to form a first opening and a second opening on the gate structure and a third opening on the gate pad structure;

(e) forming and patterning a second conductive layer to form a signal line on the passivation layer, and the signal line being perpendicular to the scanning line;

(f) sequentially forming a doping silicon layer and an electrode layer on the passivation layer and the signal line, and the doping silicon layer being electrically connected to the semiconductor layer through the first and second openings on the gate structure;

(g) patterning the electrode layer and the doping silicon layer to form a source and drain on the gate structure, and form a pixel electrode electrically connected to the drain; wherein the source is electrically connected to the signal line; and (h) removing the semiconductor layer and the first insulating layer in the gate pad structure to expose the first conductive layer in the third opening.

9. The method as claimed in claim 8, further comprising in the following steps:

forming a second insulating layer on the semiconductor layer in step (a);

patterning the second insulating layer in step (b);

exposing the second insulating layer in the first, second and third opening in step (c);

etching the second insulating layer, the semiconductor layer and the first insulating layer to expose the conductive layer in the third opening in step (h).

10. A method of fabricating a thin film transistor (TFT) flat panel display, comprising:

(a) providing a substrate which has a first conductive layer, a first insulating layer and a semiconductor layer sequentially formed thereon;

(b) patterning the semiconductor layer, the first insulating layer and the first conductive layer to form a scanning line structure, a gate pad structure and a gate structure; wherein the gate pad structure is formed at one end of the scanning line structure and the gate structure is formed at one side of the scanning line structure and extends to the gate structure;

(c) sequentially forming a passivation layer and a second conductive layer, covering the scanning line structure, the gate pad structure and the gate structure on the substrate;

(d) patterning the second conductive layer and the passivation layer so as to form a signal line structure perpendicular to the scanning line structure; wherein a first opening and a second opening are formed on the gate structure and a third opening is formed on the gate pad structure;

(e) sequentially forming a doping silicon layer and an electrode layer on the signal line structure, the gate structure and the substrate, and the doping silicon layer is electrically connected to the semiconductor layer through the first and second openings; and (f) patterning the electrode layer, the doping layer and the second conductive layer to form a source and a drain on the gate structure, and a pixel electrode coupled to the drain.

11. The method as claimed in claim 10, further comprising a step (g) for etching the semiconductor layer and the first insulating layer in the gate pad structure to expose the first conductive layer in the third opening.

12. The method as claimed in claim 11, wherein a second insulating layer is further formed on the semiconductor layer in step (a) and is patterned in step (b) to be exposed in the first, second and third openings when patterning the passivation layer in step (c); and the second insulating layer, the semiconductor layer and the first insulating layer of gate pad in the third opening are removed to expose the first conductive layer in the third opening in step (g).

* * * * *